United States Patent [19]

Erk

[11] Patent Number: 4,818,239

[45] Date of Patent: Apr. 4, 1989

[54] STACKED MULTIPIN CONNECTORS

[75] Inventor: Kaya Erk, San Jose, Calif.

[73] Assignee: Maxconn, Inc., San Jose, Calif.

[21] Appl. No.: 71,159

[22] Filed: Jul. 7, 1987

Related U.S. Application Data

[63] Continuation-in-part of Ser. No. 42,385, Apr. 24, 1987.

[51] Int. Cl.[4] ................................................ H05K 1/00

[52] U.S. Cl. ....................................... 439/55; 439/540; 439/569; 361/400

[58] Field of Search ........................ 439/55, 78, 81, 82, 439/83, 533, 540, 573, 715, 716, 717, 724, 629, 638, 655, 709, 891, 908, 65, 188, 569, 570; 361/399, 400, 393

[56] References Cited

U.S. PATENT DOCUMENTS

| | | | |
|---|---|---|---|
| 3,005,131 | 10/1961 | Melcher et al. | 439/55 |
| 3,541,494 | 11/1970 | Berg | 439/891 |
| 3,905,673 | 9/1975 | Evans et al. | 439/629 |
| 4,534,604 | 1/1985 | Peterson | 439/78 |
| 4,612,602 | 9/1986 | Weyer et al. | 439/65 |
| 4,695,116 | 9/1987 | Bailey et al. | 439/188 |

OTHER PUBLICATIONS

IBM Tech. Discl. Bulletin, "Right Angle Electrical Connector", R. G. Maples, vol. 12, #6, 11/1969 p. 887.

*Primary Examiner*—David Pirlot
*Attorney, Agent, or Firm*—Thomas Schneck

[57] ABSTRACT

A stacked electrical connector having a plurality of connector bodies for connection to connectors of opposite gender and having contact elements which are arranged in a plurality of parallel rows for electrical contact with a printed circuit board or the like, each row being spaced apart from adjacent rows. A lower connector body has a first set of angulate contact elements extending from a face. An upper connector body has a second set of angulate contact elements and a separate face. Preferably, the contact elements are of opposite genders. The upper connector body is mounted directly atop the lower connector body, but the second set of contact elements are of longer extension relative to the faces. A pin extension member having a plurality of extension pins is slidably fit to the second set of contact elements. The first set of contact elements and the extension pins terminate at least closely adjacent a common plane for insertion into a circuit board. A locking support member is inserted into the rear opening of at least one connector body. The locking support member provides support for the staggered rows of contact elements.

17 Claims, 2 Drawing Sheets

STACKED MULTIPIN CONNECTORS

CROSS-REFERENCE TO RELATED APPLICATION

This is a continuation-in-part of application Ser. No. 042,385, filed Apr. 24, 1987.

DESCRIPTION 6

1. Technical Field

This invention relates to electrical connectors and particularly to electrical connectors for insertion into printed circuit boards and the like.

2. Background Art

Mating connectors for electrically linking components of an electrical assembly are well known. Connectors are employed, to couple printed circuit boards within an instrument or to couple various instruments. U.S. Pat. Nos. 4,050,769 to Ammon; 4,080,041 to Hawkins, Jr.; and 4,469,387 to McHugh all teach right-angle connectors having contact elements that are either male or female in gender so that the contact elements may be mated to contact elements of an opposite gender. The contact elements are housed in a body member.

A goal in the design of computers and computer peripherals, as well as other types of instruments, is reduction of size. Consequently, components such as mating connectors have undergone dramatic changes in size. The original Type D connector has been largely replaced by a miniature Type D connector which, in turn, has been largely replaced by the subminiature Type D connectors of today. However, the mounting of even a subminiature connector requires a significant portion of the space on a given sized printed circuit board because the contact elements are arranged in staggered rows of standard spacing and because the connector must include ears for receipt of mounting screws or other fastening means. Rows of contact elements must be spaced sufficiently apart on a circuit board to ensure against shorting among contact elements during soldering.

Often a single printed circuit board will require a number of mating connectors. A board may, for example, be required to communicate with more than one outside instrument. Mounting of each succeeding mating connector to a board further limits the possible size reduction of a circuit board, as well as the design freedom in the routing of various signals on the circuit board. Of course, it is possible to use a single mating connector which is larger but which has a sufficient number of contact elements to couple all of the signals to and from a board. However, such a practice would require a specifically constructed cable which could branch off the signals to various circuit boards or instruments, as needed.

An object of the present invention is to provide a component which minimizes the circuit board space required for mounting of a plurality of mating connectors for separate attachment to a plurality of complementary connectors.

DISCLOSURE OF THE INVENTION

The above object has been met by a connector having a plurality of stacked bodies for connection to connectors of opposite gender and having contact elements which are arranged in a plurality of parallel rows for electrical contact with a printed circuit board or the like. Preferably, each row is equidistant from adjacent rows An advantage of the present invention is that the two connector bodies now use substantially the same circuit board space as would a single-body mating component, but without the disadvantage of requiring a specially constructed cable or other special equipment for branching off various signals to multiple boards or instruments communicating through the mating component.

A lower connector is similar to a conventional right-angle, or orthogonal, connector. The lower connector has a first mating body of either a male or female gender and has orthogonal contact elements of a like gender arranged in at least two rows in a staggered pattern. An upper connector is mounted directly atop the lower connector body by opposed C-shaped brackets. The upper connector has a second body and orthogonal contact elements. The first and second bodies normally have opposite genders in order to avoid confusion during insertion of attachment cables, but this is not critical. The right angle contact elements of the upper connector body have a rearward extension that is greater than that of the lower connector body so that the contact elements will clear the lower connector body.

An extension member having extension pins is then slidably fit to the contact elements of the upper connector body. The contact elements of the lower connector body and the extension pins terminate at least closely adjacent a common plane for insertion into a printed circuit board. Alternatively, the contact elements of the upper connector body may be elongated vertically to eliminate the need of the extension member. The extension member, however, furthers the modular aspect of the present invention since either the upper or lower connector bodies may then be used singularly.

The connector bodies each have open-ended rear sides to expose the staggered arrangements of contact elements. A locking support member is removably inserted into at least one connector body. The locking support member includes teeth which define alternating major and minor indentations for receipt of the staggered contact elements. The locking support member is the subject of prior copending application Ser. No. 042,385 and adds support to the contact elements, but is removable to facilitate repair.

BEST MODE FOR CARRYING OUT THE INVENTION

Figures 1, 2:
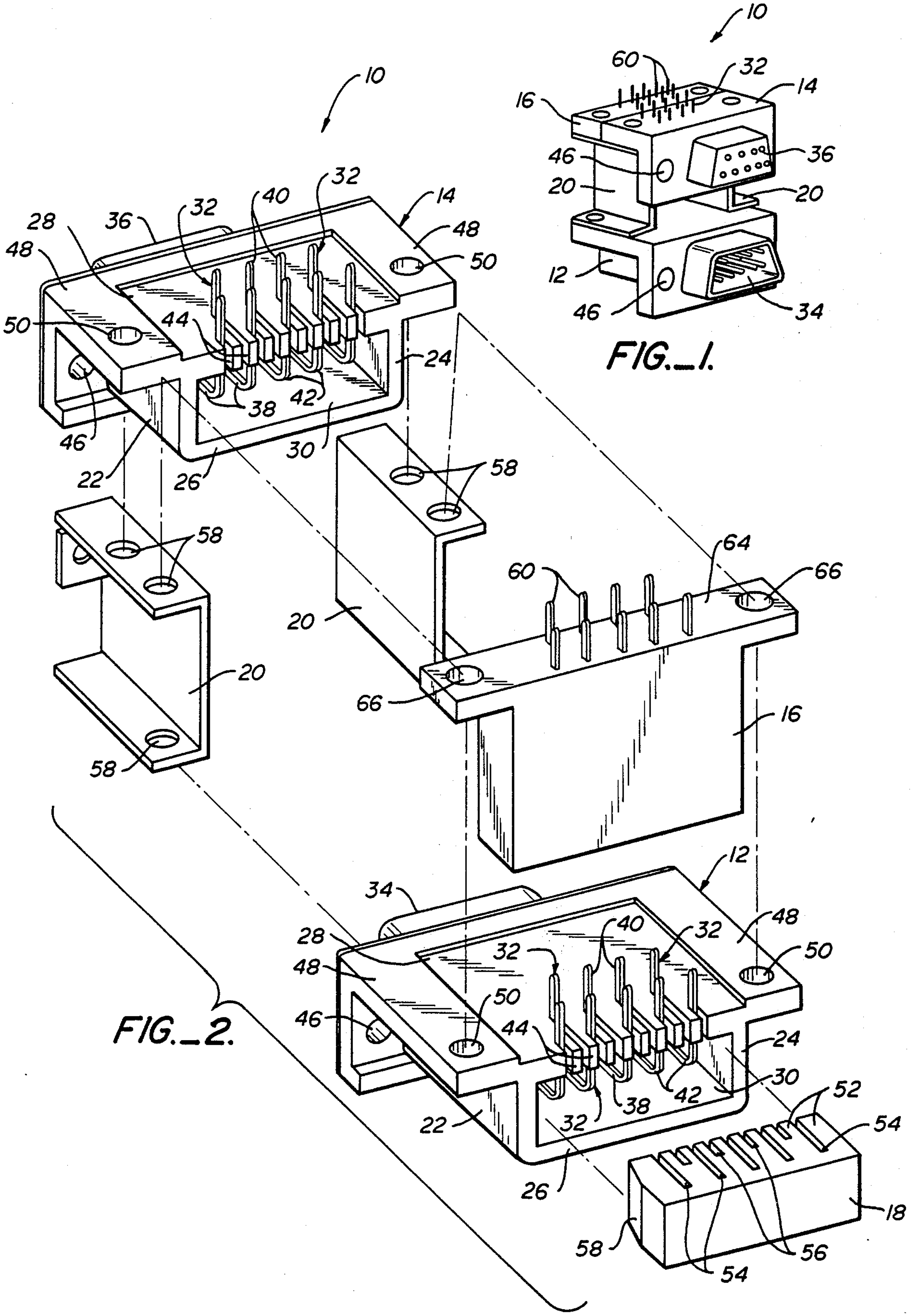
FIG. 1 is a perspective view of a stacked electrical connector in accord with the present invention.
FIG. 2 is an exploded view of the connector of FIG. 1.

With reference to FIGS. 1 and 2, a stacked electrical connector 10 is shown in an inverted position. 15 The connector 10 includes an upper connector body 12, a lower connector body 14, a pin extension member 16, a dielectric locking support member 18 and a pair of C-shaped brackets 20. The C-shaped brackets 20 are utilized to secure together the remainder of the parts.

Each of the connector bodies or members 12 and 14 are multiple contact connector members having opposed lateral housing surfaces 22 and 24, a cover surface 26 and a circuit board coupling surface 28. The surfaces 22–28 define a housing opening 30. The connector members shown in FIGS. 1 and 2 are subminiature connectors and are commonly referred to as Type D. This, however, is not critical.

The connector members 12 and 14 each have a plurality of angulate contact elements 32 press fit into the mating faces 34 and 36 of the connector members. FIG. 1 shows an upper mating face 34 of a male gender and a lower mating face 36 of a female gender. The genders may be reversed, or alternatively the mating faces may be of the same gender, but this is not preferred since it would lead to possible confusion during connection of cables to the mating faces.

The contact elements 32 each have a mating rectilinear segment 38, an attachment rectilinear segment 40 and an angulate segment 42 joining the rectilinear segments. The attachment rectilinear segments 40 are received by slots 44 in the coupling surfaces 28 of the connector members 12 and 14. The contact elements 32 of a right angle connector are typically arranged in at least two rows, with the contact elements disposed in the rows in an alternating fashion relative to a plane extending parallel the contact elements. This staggered arrangement occurs at both the mating and the attachment rectilinear segments 38 and 40. The slots 44 are utilized to facilitate alignment and support of the contact elements during insertion into the plated holes of a circuit board and are accordingly staggered in length.

The mating rectilinear segments 38 of the contact elements are press fit into the mating surface 34 and 36. The contact elements 32 may be either male pins or female sockets. Mounting holes 46 on the opposed sides of the mating surfaces 34 and 36 are disposed to receive fastening bolts, not shown, for fastening the mating component 10 to a panel of an instrument and/or to a connector of a gender opposite a mating face.

The circuit board coupling surface 28 of each connector member 12 and 14 has a stepped portion 48 to stand the coupling surface 28 away from the surface of a circuit board, thereby permitting enhanced solder flow between the coupling surface and the circuit board. The stepped portion 48 of a connector member includes spatially opposed bores 50 which are typically used to receive fastening hardware, not shown, for manually mounting a connector to a circuit board.

By itself, a connector member 12 and 14 provides relatively little support to the contact elements 32. Depending upon how tightly the contact elements are held at the mating surfaces 34 and 36, a certain amount of play exists at the tip of the mating rectilinear segment 38. The play is greatest when the contact elements 32 are secured to the connector member by means of wings which are biased outwardly from the circumference of the contact elements so that the tips of the contact elements cannot reenter a bore after the wings have been released. Any play is detrimental since movement will permit misalignment of a male pin with a female socket during connector engagement. Such misalignment may result in the bending of contact elements, especially freestanding pins. Additionally, bending of contact elements may occur as a result of the force placed upon the contact element during insertion into a printed circuit board.

To prevent bending of contact elements 32 the present invention includes at least one locking support member 18 having teeth 52 which define major indentations 54 and minor indentations 56. The indentations 54 and 56 receive contact elements 32 when the support member 18 is fitted into the housing opening 30 of a connector member. The indentations 54 and 56 are staggered so as to enhance the support of the staggered contact elements 32. Such staggering allows each indentation 54 and 56 to house, in at least a closely adjacent manner, the contact elements which vary in extension relative to the mating surfaces 34 and 36. Preferably, each indentation houses a portion of an attachment rectilinear segment 40 and at least a portion of the angulate segment 42 of a contact element, and the teeth 52 contact opposed sides of the contact element. Such an arrangement provides the support necessary to guard against misalignment of contact elements during engagement of the mating component 10 to cable connectors or to a circuit board.

FIG. 2 shows a single locking support member 18 but it is contemplated to provide both connector members 12 and 14 with support members. The support member 18 of FIG. 2 is shown in position for insertion into the upper connector member 12 since the support member serves a second purpose with regard to the upper connector member. The support member prevents conductive debris from entering the housing opening 30. Thus, the support member 18 aids in preventing electrical shorting between contact elements. A locking support member 18 is inserted into a connector member for frictional engagement therewith. The forward edges 58 are beveled to facilitate insertion.

Figure 3:
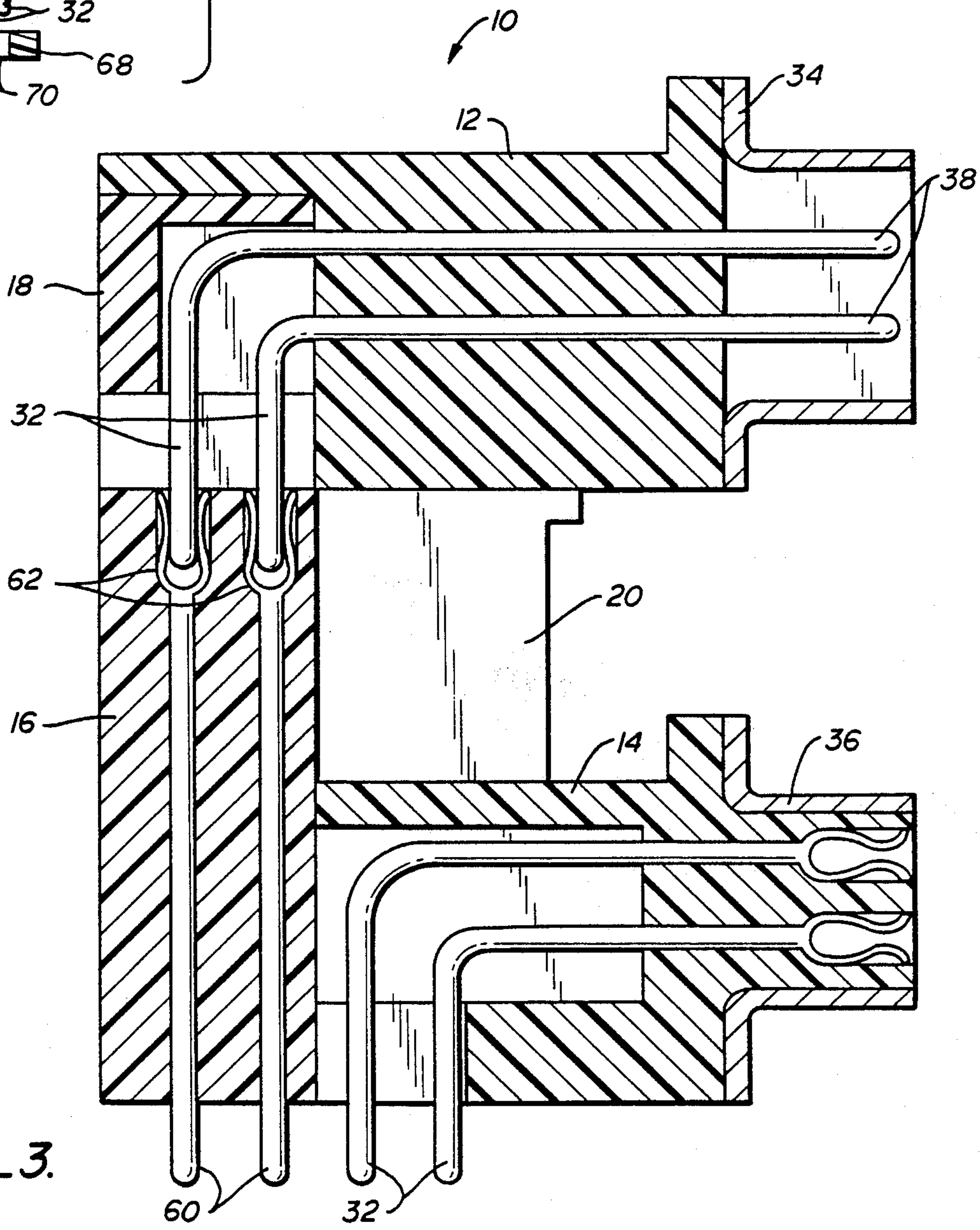
FIG. 3 is a sectional view of the connector of FIG. 1.

Referring now to FIGS. 2 and 3, the upper and lower connector members 12 and 14 are secured to each other by C-shaped brackets 20 which are fastened to the individual connector members by insertion of fastening members through holes 58 in the brackets 20 and through the mounting bores 50 in the connector members. The present invention is a modular assembly since the mating component 10 may be disassembled, and the upper and lower connector members may then be used independently of each other without modification. This is possible because a removable pin extension member 16 is utilized to electrically extend the male pin contact elements 32 of the upper connector member 12 to the same termination plane as the female socket contact elements 32 of the lower connector member 14. The pin expansion member includes a number of conductive extension pins 60 matching the number of contact elements 32 of the upper connector member. Each extension pin 60 has a socketed extremity 62 to slidably receive a contact element 32. The contact elements of the upper connector member 12 must have lengthier mating rectilinear segments 38 than those of the lower connector member 14, so as to project beyond the lower connector member. The mounting surface 64 of the pin extension member 16 has bores 66 for mounting to the C-shaped brackets 20.

The housing surfaces 22–28 of the connector members 12 and 14 are constructed of a dielectric material. The mating faces 34 and 36 are made of a sturdy material such as steel and are plated with zinc or lead. The contact elements 32 are typically brass with gold flash over an undercoating of nickel. The number of contact elements associated with a connector member is not critical, but numbers of 9, 15, 25 and 37 contact elements are standard. The pin extension member 16 and the locking support member 18 are dielectric materials.

Figure 4:
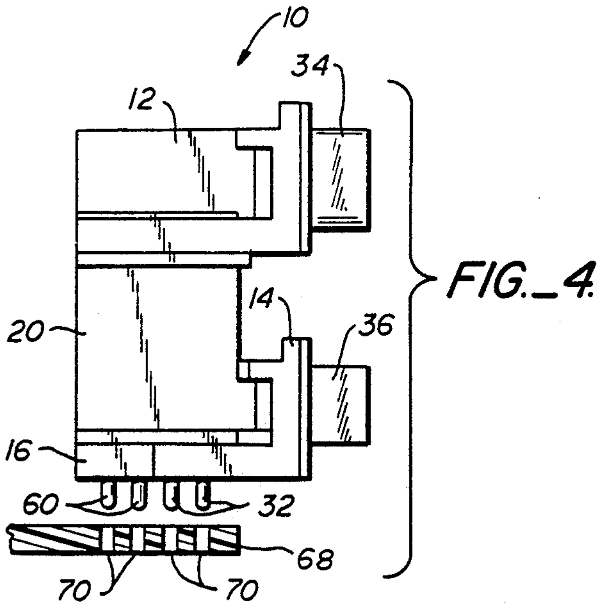
FIG. 4 is a side view of the connector of FIG. 1 prior to insertion into a printed circuit board.

In operation, the mating component 10 is positioned above a printed circuit board 68, as shown in FIG. 4.

The ends of the extension pins 60 and the contact elements 32 of the lower connector member 14 are then inserted into the plated holes 70 of the circuit board. The mating component 10 is fastened to the circuit board and the extension pins and contact elements are soldered to the plated holes 70. Connection cables, not shown, may then be attached to the mating faces 34 and 36.

By incorporating two mating faces in a single mating component, it is possible for a circuit board to communicate with two other circuit boards or with two separate instruments by means of a single mating component. As noted above, this would also be possible by increasing the number of contact elements in a conventional connector. However, such an arrangement would require special equipment, such as a specially constructed cable which would branch off the various signals as needed. The present invention obviates the need of specially constructed equipment but requires no more circuit board real estate than does a single-faced mating component having an equal number of contact elements. The side view of the lower connector member 14 in FIG. 4 gives an indication of the amount of circuit board space required to mount a conventional mating component. The mating component 10 of FIG. 4, however, requires only approximately one-half that space to provide twice the number of electrical connections that lead to separate mating faces. The rows of contact elements 32 and extension pins 60 are equidistant from adjoining rows, just as the rows would be disposed in a conventional mating component having a single mating face.

While the drawings illustrate the contact elements 32 to be orthogonal contact elements for communication with a printed circuit board, it is to be understood that the angulate contact elements need not be angled at 90 and need not be mounted to a circuit board. Likewise, the pin extension member is not critical since the contact elements 32 of the upper connector member 12 may be elongated to make direct contact with a circuit board or the like. Additionally, the connector members 12 and 14 may be integral. The pin extension member, however, furthers the modular aspect of the present invention since the connector members in the present form may be used singularly, without clipping off portions of the contact elements. It is contemplated to stack the connector members higher, using progressively longer pin extension members.

I claim:

1. A stacked electrical connector of the type for engaging external devices, comprising, an upper connector body having a first connector face and a plurality of angulate first contact elements, said first connector face having first engaging means for selectively coupling said upper connector to a first external device, the first contact elements each having a first segment extending rearwardly from said first connector face and second segment extending downwardly from said first segment, a pair of bracket members, each having a first end mounted to said upper connector body and each having a second end, said bracket members maintained in horizontally spaced apart relation by said mounting to the upper connector body, and a lower connector body joined to said second ends of the pair of brackets in adjacent yet vertically spaced relation to said upper connector body, said lower connector body having a second connector face and a plurality of angulate second contact elements, said second connector face having second engaging means for selectively coupling said lower connector to a second external device, the second elements each having a first segment extending rearwardly from said second connector face and a second segment extending downwardly from said first segment, said first and second contact elements of said upper and lower connectors being electrically conductive and having a downward extend sufficient for attachment to a printed circuit board.

2. The stacked connector of claim 1 wherein said first and second contact elements are unitary right-angle contact elements.

3. The stacked connector of claim 1 wherein said upper and lower connectors are spaced apart by C-shaped bracket members.

4. The stacked connector of claim 1 wherein each downwardly extending segment of said first contact elements is in electrical communication with a conductive extension pin having a length sufficient for contact into a printed circuit board, said downwardly extending segments of said second contact elements and said extension pins each terminating at least closely adjacent to a common plane, said extension pins disposed in an extension member and each having means to slidably receive a first contact element.

5. The stacked connector of claim 2 wherein said conductive extension pins are arranged in a plurality of parallel rows, each row being substantially equidistant from adjacent rows.

6. A stacked electrical connector comprising, a lower connector body having a first mating face having a configuration to receive a first external connector member in a slidable relation, first and second spaced apart bracket members, each mounted to said lower connector body and each extending upwardly from said lower connector body, an upper connector body mounted to said first and second bracket members in adjacent yet vertically spaced apart relation to said lower connector member, said upper connector body having a second mating face parallel to said first mating face, said second mating face having a configuration to receive a second external connector member in a slidable relation, a first set of unitary angularly bent electrically conductive contact elements having first segments attached to said first mating face and having second segments projecting from said lower connector body, said second segments being capable of electrical connection along a single contact plane, and a second set of unitary angularly bent electrically conductive contact elements having first segments attached to said second mating face and having second segments projecting from said upper connector body, said second segments being extended for electrical connection along said single contact plane.

7. The stacked electrical connector of claim 6 wherein said second segments of the second set of contact elements are extended for electrical connection by an extension means, said extension means including a plurality of conductive extension pins slidably fit to said second segments.

8. The stacked electrical connector of claim 6 wherein said contact elements of the first and second set of contact elements are bent at right angles.

9. The stacked electrical connector of claim 6 wherein said contact elements of the first set of contact elements are all either male pins or female sockets and the contact elements of the second set of contact elements are all the other of either male pins or female sockets.

10. The stacked electrical connector of claim 7 wherein said second segments of the first set of contact elements and said extension pins are arranged in a plurality of parallel rows, each row being equidistant from adjacent rows.

11. A modular, stacked electrical connector comprising, a first connector member having a front side, a first set of angulate unitary contact elements at least partially housed within said first rectilinear segment extending perpendicularly to said front said of the first connector member and having a second rectilinear segment extending from said first connector member, said first set of angulate contact elements disposed in an array of at least two rows, a pair of spaced apart brackets fixed at opposed sides of said first connector member, a second connector member having a front side, side second connector member being mounted to said pair of brackets in adjacent but spaced apart relation to said first connector member, a second set of unitary angulate contact elements, each having a first rectilinear segment extending perpendicular to said front side of the second connector member and having a second rectilinear segment extending from said second connector member, said second set of angulate contact elements disposed in an array of at least two rows spaced apart from said first set by a distance exceeding the distance between said rows of angulate contact elements, and a pin extension member having a plurality of conductive extension pins, each slidably fit to a second rectilinear segment of the second set of angulate contact elements, said contact elements of said first and second set of contact elements having mating ends terminating at least closely adjacent a first common plane, said first set of contact elements and said extension pins each having ends terminating at least closely adjacent a second common plane.

12. The modular connector of claim 11 further having at least one locking support member, said first and second connector members each having body walls defining a connector member interior and having an open-ended rear side for receiving said locking support member, said locking support member having teeth spaced apart defining indentations to coincide with the extension of contact elements of a connector member, relative to the front face of the connector member.

13. The modular connector of claim 12 wherein said contact elements alternate in extension relative to the front side of an associated connector member.

14. The modulator connector of claim 11 wherein said pair of brackets are C-shaped brackets.

15. The modular connector of claim 11 wherein said contact elements of the first and second set of contact elements are bent at right angles.

16. The modular connector of claim 11 wherein said second segments of said first set of contact elements and said extension pins are arranged in a plurality of parallel rows, each row being equidistant from adjacent rows.

17. A stacked electrical connector comprising, an upper connector body having a first connector face and a plurality of angulate first contact elements arranged in at least two rows, the first contact elements each having a first segment extending rearwardly from said first connector face and a second segment extending downwardly from said first segment, a lower connector body fixed in adjacent yet vertically spaced relation to said upper connector body and having a plurality of angulate second contact elements arranged in at least two rows, said lower connector body having a second connector face, the second elements each having a first segment extending rearwardly from said second connector face and a second segment extending downwardly from said first segment, said first and second contact elements of said upper and lower connectors being electrically conductive and having a downward extent exceeding the downward extent of said lower connector body, and a pair of spaced apart C-shaped bracket members, each mounted to each of said upper and lower connectors, said connectors fixed in spaced apart relation by said C-shaped bracket members.

* * * * *

UNITED STATES PATENT AND TRADEMARK OFFICE

CERTIFICATE OF CORRECTION

PATENT NO. : 4,818,239

DATED : April 4, 1989

INVENTOR(S) : Kaya Erk

It is certified that error appears in the above-identified patent and that said Letters Patent is hereby corrected as shown below:

Column 2, line 2, "rows" should read - - rows. - -

Claim 1, column 6, line 12, "extend" should read - - extent - -.

Claim 11, column 7, lines 20-21, "said first rectilinear segment" should read - - said first connector member, each contact element having a first rectilinear segment - -.

Claim 11, column 7, line 21, after "front", "said" should read - - side - -.

Signed and Sealed this

Twenty-fourth Day of July, 1990

*Attest:*

HARRY F. MANBECK, JR.

*Attesting Officer*

*Commissioner of Patents and Trademarks*